(12) United States Patent
Chen et al.

(10) Patent No.: US 7,498,228 B2
(45) Date of Patent: Mar. 3, 2009

(54) METHOD FOR FABRICATING SONOS A MEMORY

(75) Inventors: Tzu-Ping Chen, Hsin-Chu (TW);
Chien-Hung Chen, Hsin-Chu (TW);
Pei-Chen Kuo, Taichung County (TW);
Shen-De Wang, Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/775,223

(22) Filed: Jul. 9, 2007

(65) Prior Publication Data

US 2009/0017590 A1    Jan. 15, 2009

(51) Int. Cl.
*H01L 21/336* (2006.01)

(52) U.S. Cl. .................. 438/287; 438/288; 438/591; 257/E21.18; 257/E21.194; 257/E21.21; 257/E21.423

(58) Field of Classification Search ............... 438/287, 438/288, 591, FOR. 431, FOR. 212; 257/E21.18, 257/E21.194, E21.21, E21.423
See application file for complete search history.

(56) References Cited

U.S. PATENT DOCUMENTS

| | | | |
|---|---|---|---|
| 6,576,511 B2* | 6/2003 | Pan et al. | 438/257 |
| 6,707,078 B1* | 3/2004 | Shiraiwa et al. | 257/208 |
| 6,740,605 B1* | 5/2004 | Shiraiwa et al. | 438/795 |
| 6,774,432 B1* | 8/2004 | Ngo et al. | 257/325 |
| 6,881,619 B1* | 4/2005 | Lee et al. | 438/216 |
| 6,894,342 B1* | 5/2005 | Hui et al. | 257/317 |
| 6,933,219 B1* | 8/2005 | Lingunis et al. | 438/593 |
| 6,949,433 B1* | 9/2005 | Hidehiko et al. | 438/261 |
| 7,018,896 B2* | 3/2006 | Ngo et al. | 438/261 |
| 7,091,088 B1* | 8/2006 | Cheng et al. | 438/257 |
| 7,098,107 B2* | 8/2006 | Bloom et al. | 438/261 |
| 7,118,967 B1* | 10/2006 | Ngo et al. | 438/261 |
| 7,279,392 B2* | 10/2007 | Lee et al. | 438/396 |
| 2004/0151025 A1* | 8/2004 | Ngo et al. | 365/185.01 |
| 2006/0017121 A1* | 1/2006 | Arai et al. | 257/411 |

* cited by examiner

*Primary Examiner*—George Fourson
(74) *Attorney, Agent, or Firm*—Winston Hsu

(57) ABSTRACT

A method for fabricating a SONOS memory is disclosed. First, a semiconductor substrate is provided and a SONOS memory cell is formed on said semiconductor substrate. A passivation layer is deposited on the SONOS memory cell and a contact pad is formed on the passivation layer. Subsequently, an ultraviolet treatment is performed and an annealing process is conducted thereafter.

17 Claims, 14 Drawing Sheets

METHOD FOR FABRICATING SONOS A MEMORY

BACKGROUND OF THE INVENTION

1. Field of the Invention

The invention relates to a method for fabricating a SONOS memory.

2. Description of the Prior Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased electrically.

Product development efforts in memory device technology have focused on increasing the programming speed, lowering programming and reading voltages, increasing data retention time, reducing cell erasure times and reducing cell dimensions. Some of the flash memory arrays today utilize a gate structure made of dual polysilicon layers (also refers to as the dual poly-Si gate). The polysilicon layer utilized in these gate structures often includes a dielectric material composed of an oxide-nitride-oxide (ONO) structure. When the device is operating, electrons are injected from the substrate into the bottom layer of the dual polysilicon layers for storing data. Since these dual gate arrays typically store only one single bit of data, they are inefficient for increasing the capacity of the memory. As a result, a flash memory made of silicon-oxide-nitride-oxide-silicon (SONOS) is derived. Preferably, a transistor from these memories is capable of storing two bits of data simultaneously, which not only reduces the size of the device but also increases the capacity of the memory significantly. The operation of a typical SONOS memory is described below.

During the programming of a typical SONOS memory, electrical charge is transferred from a substrate to the charge storage layer in the device, such as the nitride layer in the SONOS memory. Voltages are applied to the gate and drain creating vertical and lateral electric fields, which accelerate the electrons along the length of the channel. As the electrons move along the channel, some of them gain sufficient energy to become trapped in the charge storage dielectric material. This jump is known as hot carrier injection, in which the hot carriers being the electrons. Charges are trapped near the drain region as the electric fields are strongest near the drain. Reversing the potentials applied to the source and drain will cause electrons to travel along the channel in the opposite direction and be injected into the charge storage dielectric layer near the source region. Since part of the charge storage dielectric layer are electrically conductive, the charge introduced into these parts of the charge storage dielectric material tend to remain localized. Accordingly, depending upon the application of voltage potentials, electrical charge can be stored in discrete regions within a single continuous charge storage dielectric layer.

Please refer to FIGS. 1-6. FIGS. 1-6 illustrate a method for fabricating a SONOS memory according to the prior art. As shown in FIG. 1, a semiconductor substrate 12 is provided, in which the semiconductor substrate 12 is preferably composed of gallium arsenide (GaAs), silicon on insulator layer, epitaxial layer, silicon germanium, or other common semiconductor substrate materials. Next, a silicon oxide layer 14, a silicon nitride layer 16, a silicon oxide layer 18, and a polysilicon layer 20 is formed on the semiconductor substrate 12.

Next, as shown in FIG. 2, a pattern transfer process is conducted by utilizing a patterned photoresist (not shown) as a mask to perform an etching process for removing a portion of the polysilicon layer 20, the silicon oxide layer 18, the silicon nitride layer 16, and the silicon oxide layer 14. The result produces a stacked gate 22 on the semiconductor substrate 12. The stacked gate 22 is preferably composed of a control gate formed by a portion of the polysilicon layer 20 and an ONO structure formed by a portion of the silicon oxide layer 14, the silicon nitride layer 16, and the silicon oxide layer 18. Accordingly, the silicon nitride layer 16 can be used as a charge storage layer while the memory cell is being programmed or erased.

As shown in FIG. 3, an ion implantation process (not shown) is performed by using the stacked gate 22 as a mask to form a source/drain region 24 in the semiconductor substrate 12 beside the two sides the stacked gate 22.

As shown in FIG. 4, an inter-layer dielectric 28 is formed on the semiconductor substrate 12 and the stacked gate 22. Another pattern transfer process is conducted by using a patterned photoresist (not shown) as a mask to perform an etching process for forming a plurality of contact holes (not shown) in the inter-layer dielectric 28. Thereafter, a metal composed of tungsten is deposited on the inter-layer dielectric 28 and into each of the contact holes. A plurality of contact plugs 30 is then formed in the inter-layer dielectric 28.

As shown in FIG. 5, a metal interconnection process is conducted by first forming a plurality of inter-metal dielectrics 32 and 34 on the inter-layer dielectric 28 and a plurality of metal interconnects 36 connected to the contact plugs 30.

As shown in FIG. 6, a passivation layer 38 is deposited on the surface of the top metal interconnects 36. A pattern transfer process is conducted by forming a patterned photoresist (not shown) as a mask to perform an etching process for forming an opening in the passivation layer 38. After the opening exposes the top patterned metal interconnect, a contact pad 40 is formed.

After the formation of the contact pad 40, an annealing process is performed to reduce the chance of electrical malfunctioning and facilitate a much more even voltage distribution. Subsequently, an ultraviolet treatment is performed to release the charges accumulated during the fabrication process of the memory cell. In most cases, charges accumulated within the memory device during the fabrication process would often induce in uncontrollable threshold voltage and often result in damage of the entire device.

Please refer to FIG. 7. FIG. 7 illustrates the threshold voltage of a SONOS memory during different stages of the fabrication process according to the prior art. As shown in FIG. 7, when the annealing process is performed, the distributing range of the threshold voltage is approximately 1.5V. It should be noted that in the conventional method for fabricating a SONOS memory, the annealing process is conducted after the formation of the contact pad 40 and before the ultraviolet treatment. This order of fabrication releases charges stored in the charge storage layer but also increases the distributing range of the initial threshold voltage, which ultimately narrows the sensing boundary during the programming or erasing stage of the SONOS memory and increases the chance of miscalculations.

Additionally, the annealing process performed would reduce the voltage of the high voltage cells and cause the voltage of the cells to approximate to the main distribution region. However, the ultraviolet treatment performed after the annealing process, which often has the ability to increase the voltage of voltage cells, would not only increase the voltage of the low voltage cells but also raise the voltage of the high voltage cells to a much higher state. The end result would cause the central value of the overall electrical distribution to be higher than the neutral state.

SUMMARY OF THE INVENTION

It is an objective of the present invention to provide a method of fabricating a SONOS memory for resolving the aforementioned problems.

A method for fabricating a SONOS memory is disclosed. First, a semiconductor substrate is provided and a SONOS memory cell is formed on said semiconductor substrate. A passivation layer is deposited on the SONOS memory cell and a contact pad is formed in the opening of the passivation layer. Subsequently, an ultraviolet treatment is performed and an annealing process is conducted thereafter.

The present invention specifically performs an ultraviolet treatment after the fabrication of the passivation layer and the contact pads is completed and performs an annealing process thereafter. According to the preferred embodiment of the present invention, by conducting an ultraviolet treatment with a follow-up annealing process, a narrower distributing boundary of the threshold voltage can be obtained. This result not only reduces the chance of sensing error, but also improves the drawback of uneven charge distribution resulted from the plasma effect commonly caused during the fabrication of the contact holes or contact pads. In other words, by utilizing the order of performing the ultraviolet treatment first and the annealing process after, the present invention is able to obtain a much more even charge distribution within the memory and at the same time reduce the chance of sensing error caused by overly large distribution range of the initial threshold voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
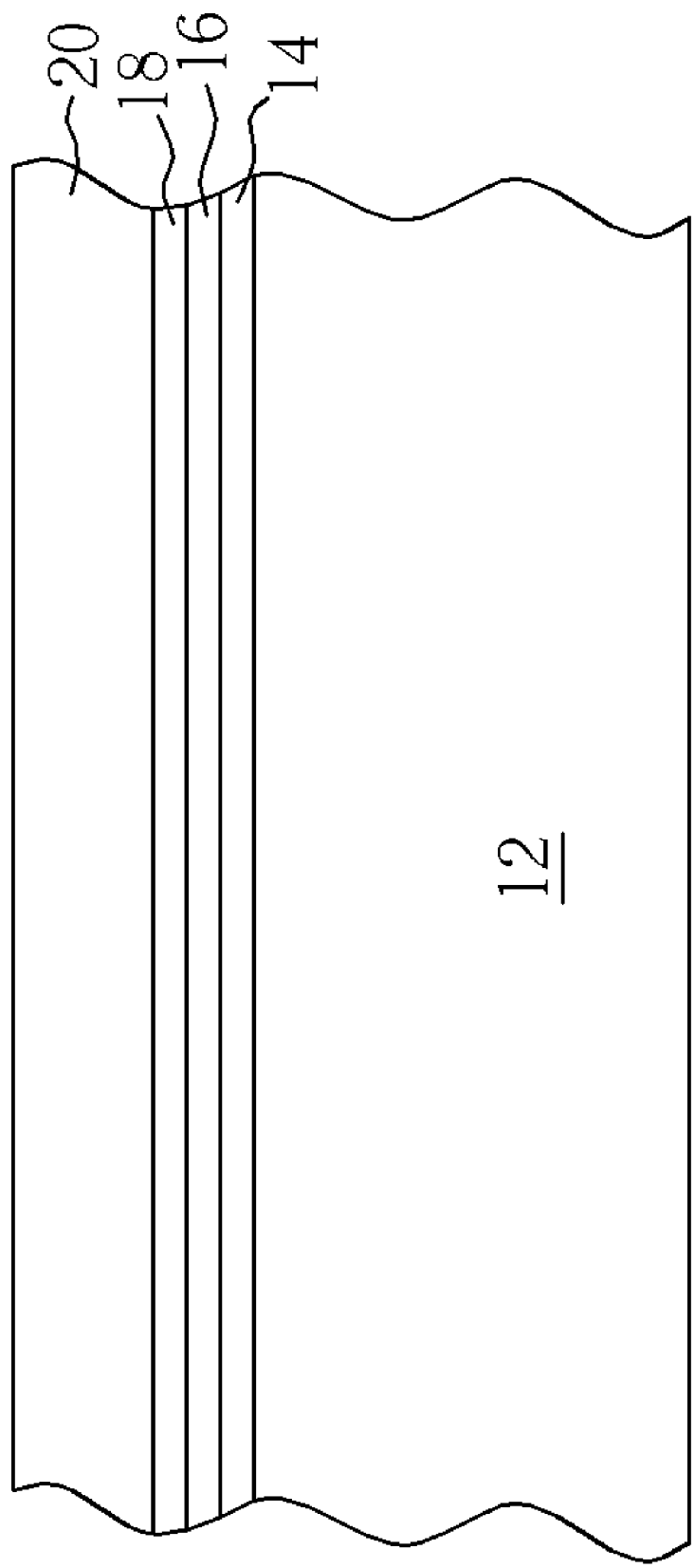
FIGS. 1-6 illustrate a method for fabricating a SONOS memory according to the prior art.
Figure 2:
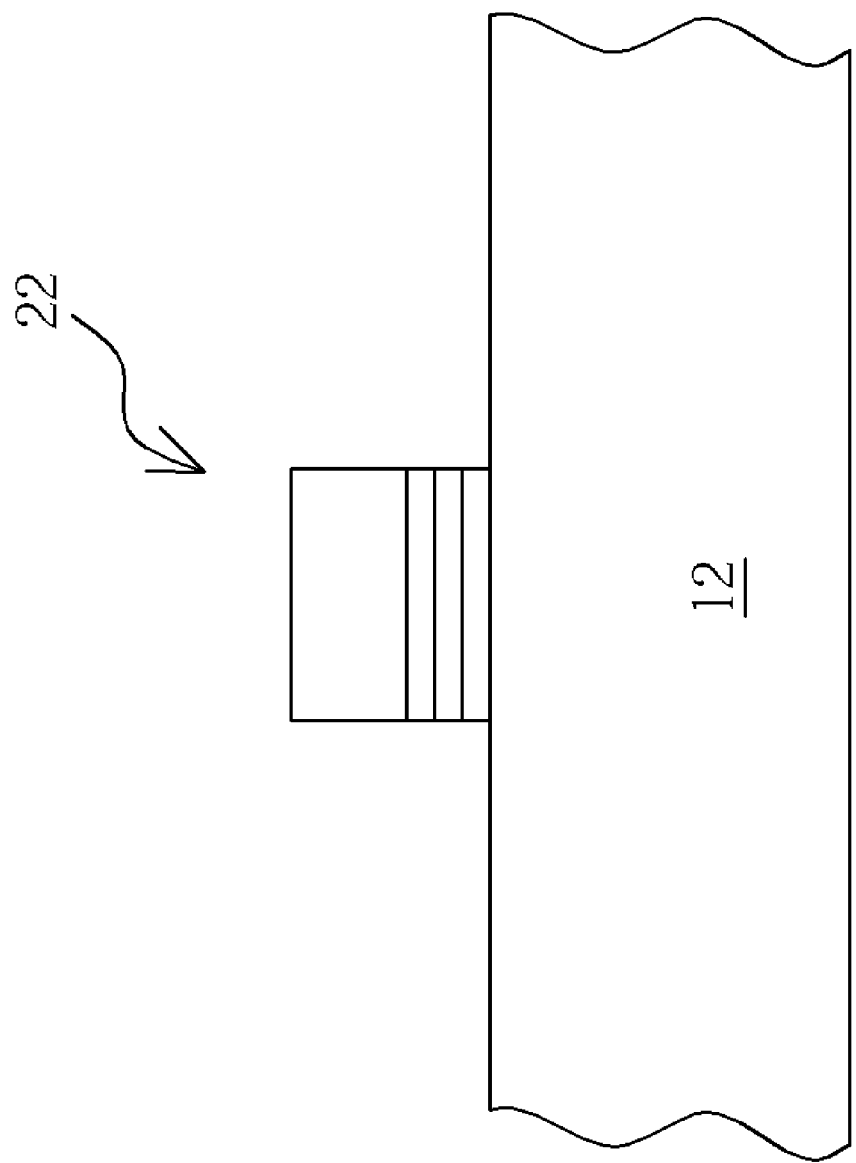
Figure 3:
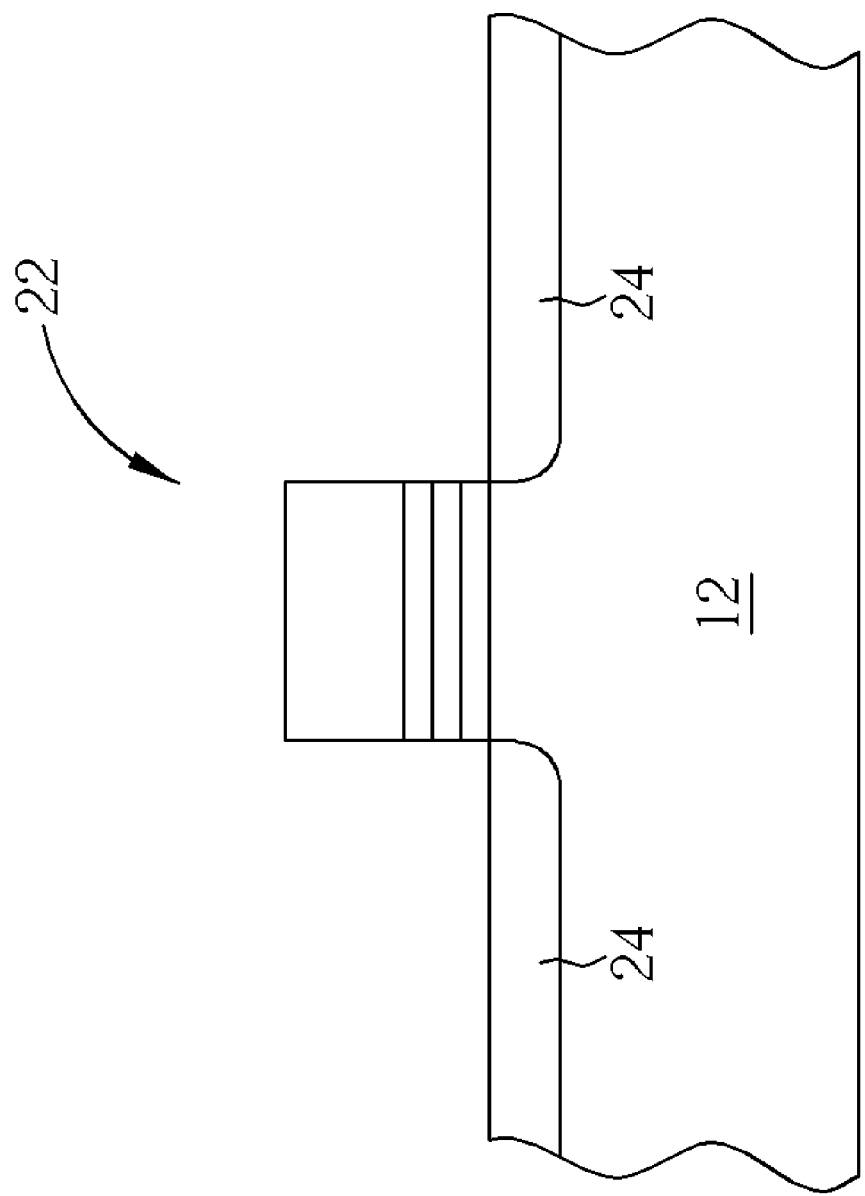
Figure 4:
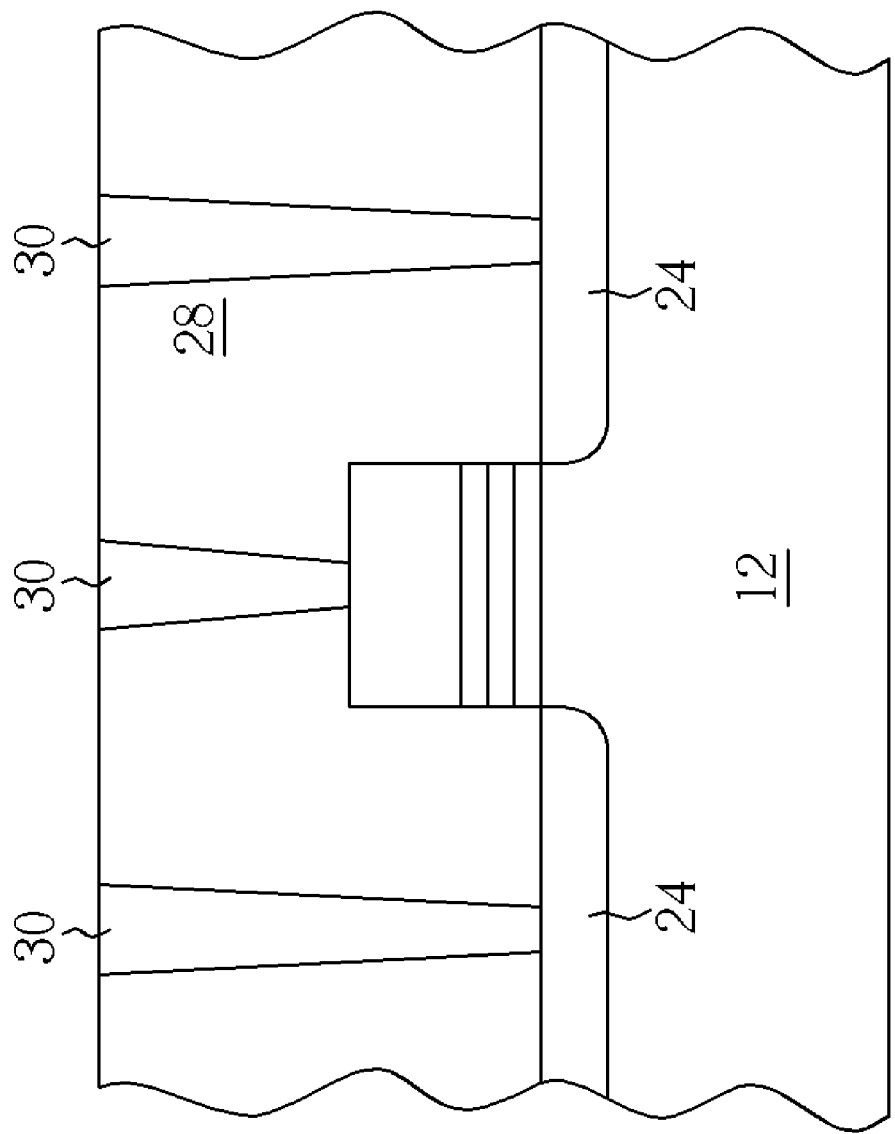
Figure 5:
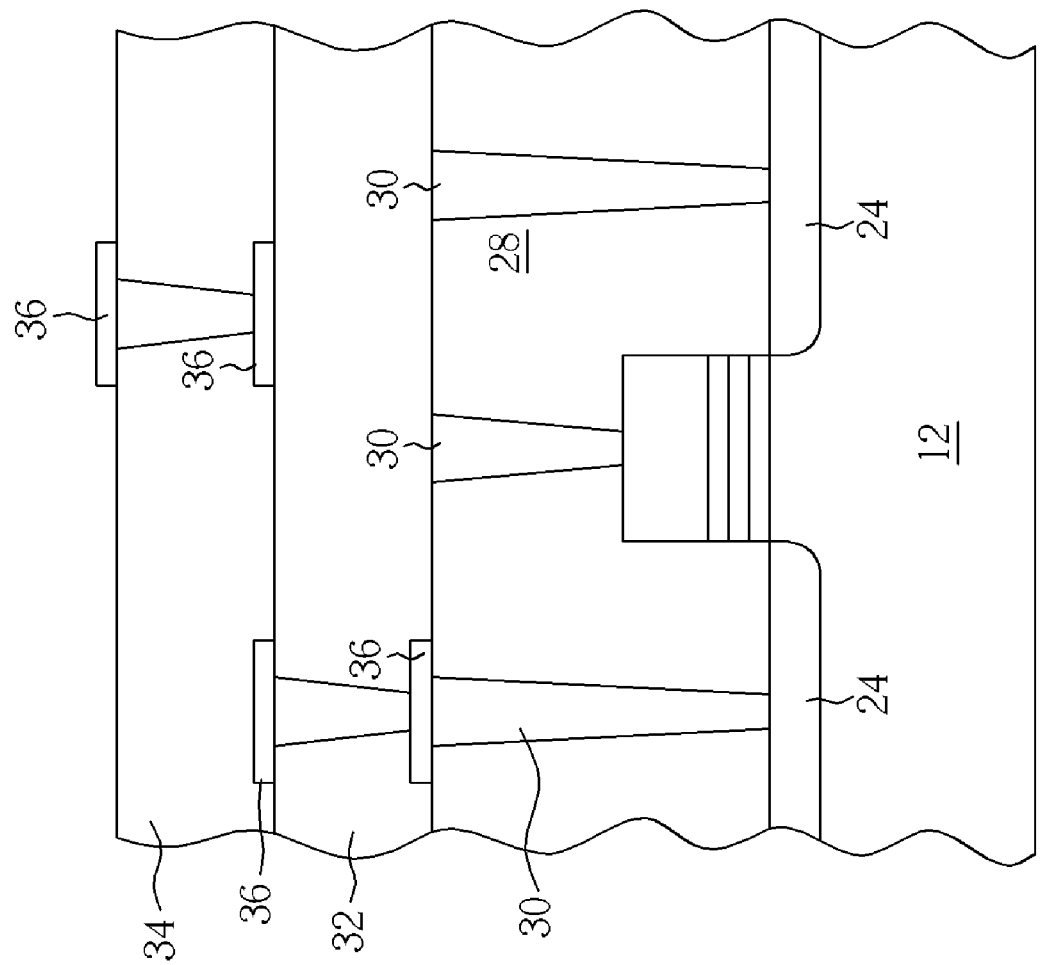
Figure 6:
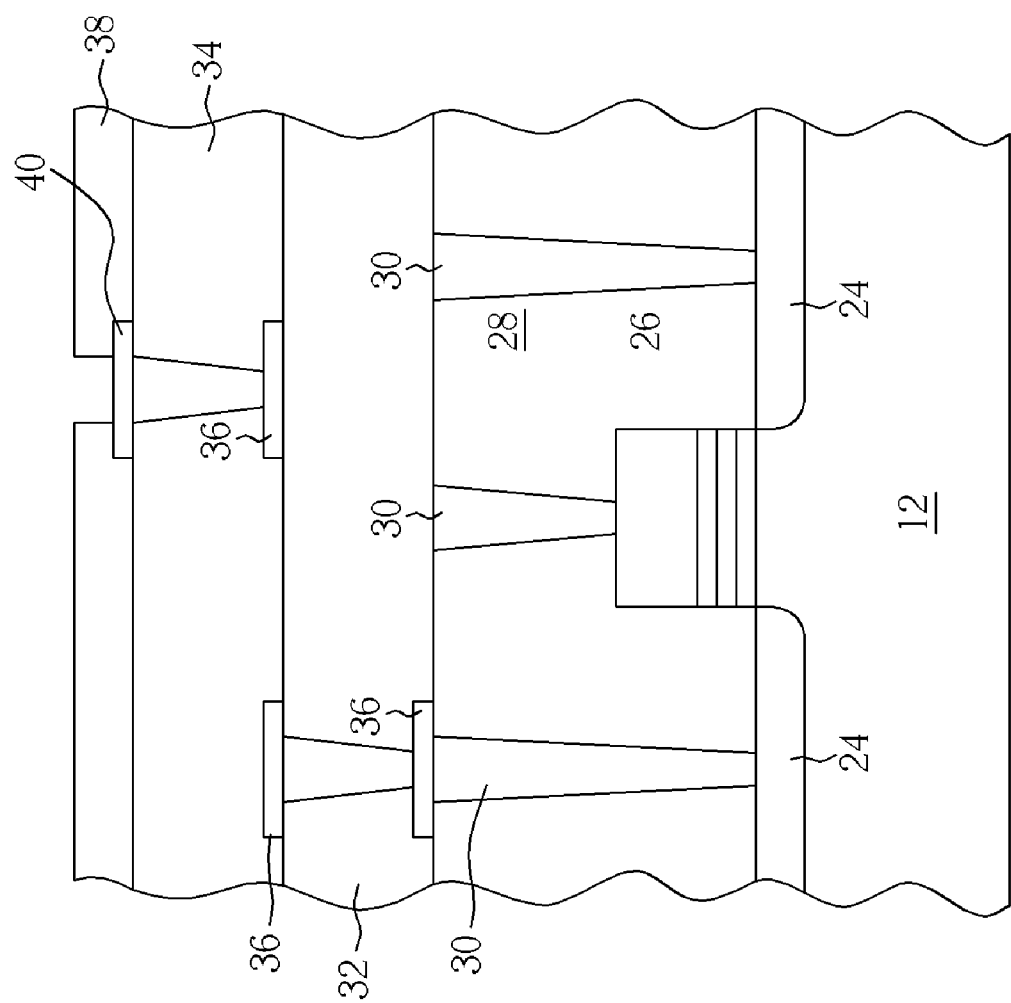
Figure 7:
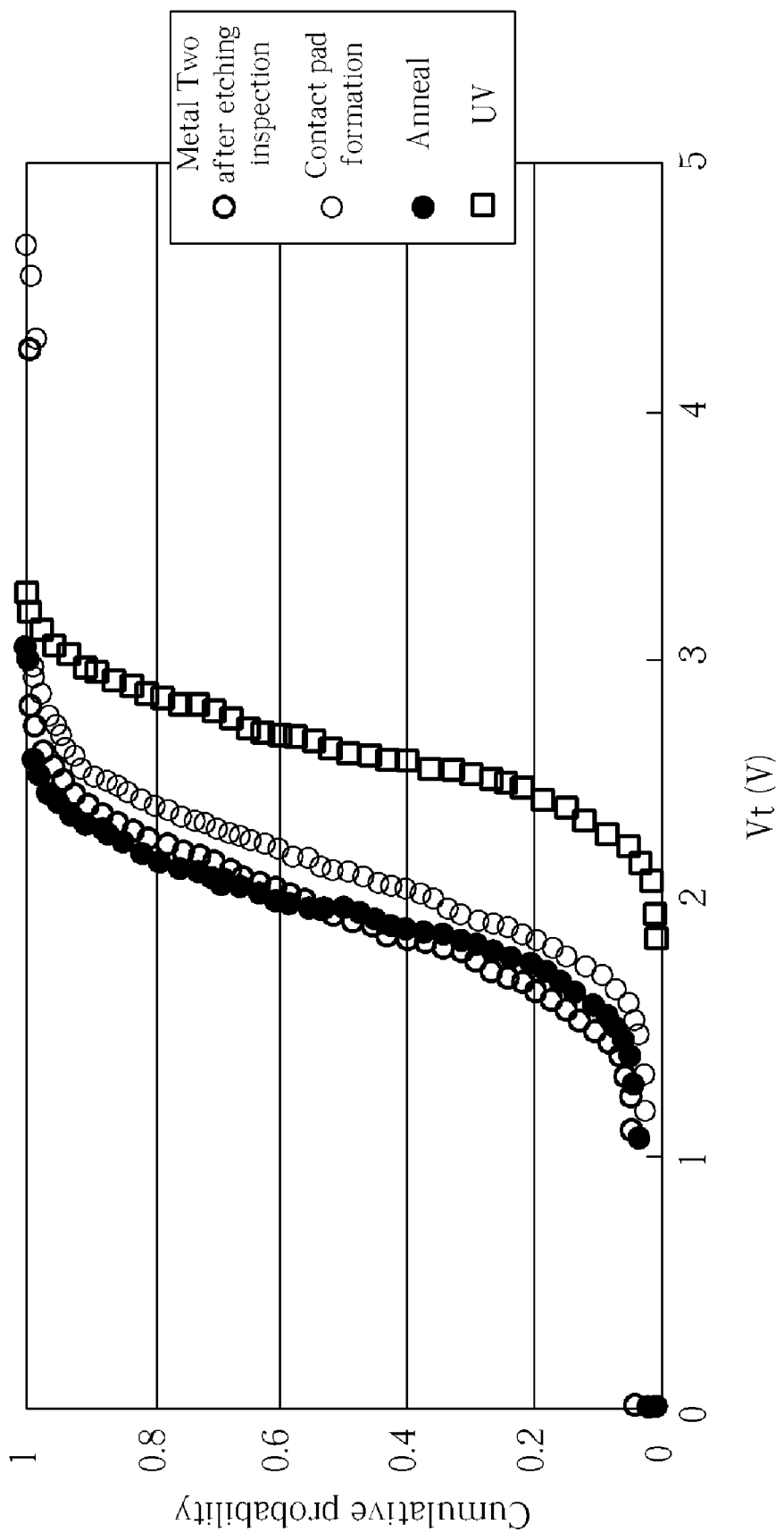
FIG. 7 illustrates the threshold voltage of a SONOS memory during different stages of the fabrication process according to the prior art.
Figure 8:
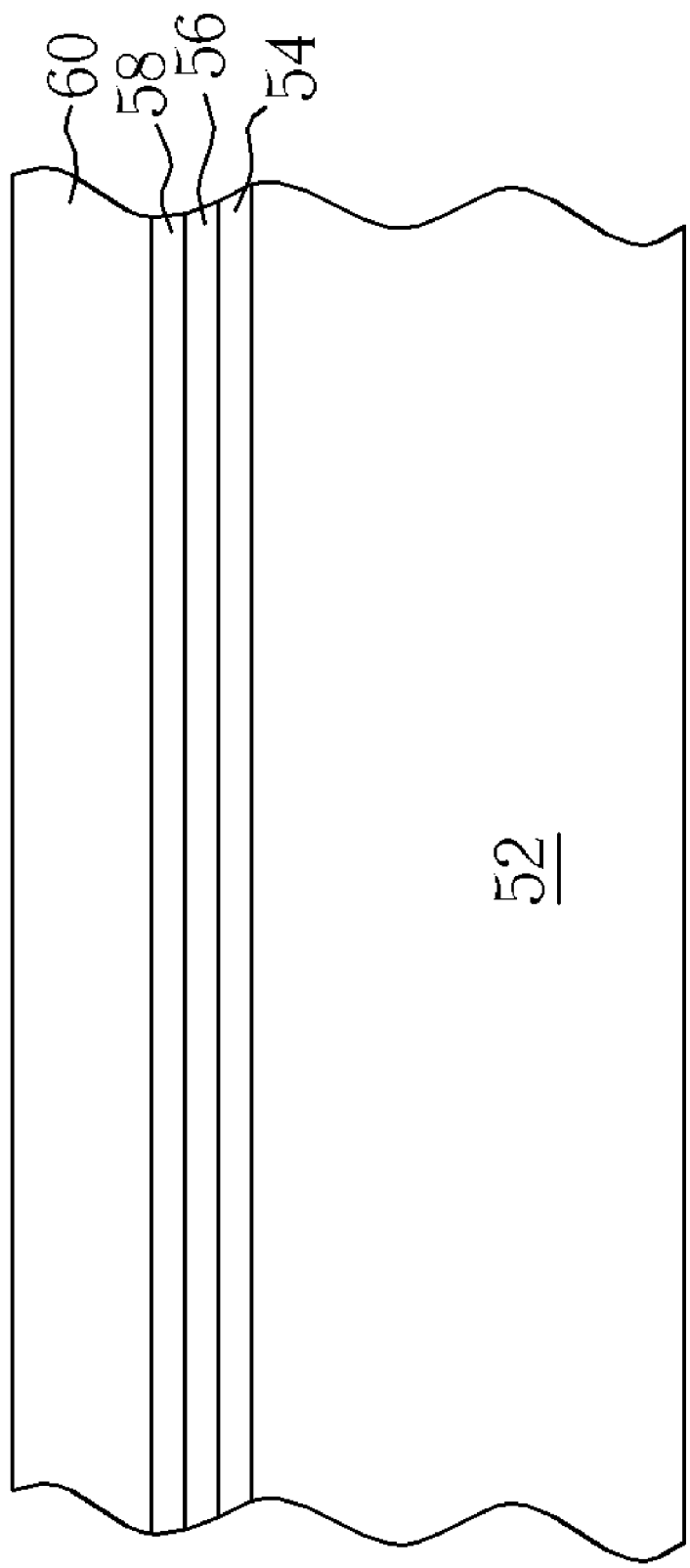
FIGS. 8-13 illustrate a method for fabricating a SONOS memory according to the preferred embodiment of the present invention.

Please refer to FIGS. 8-13. FIGS. 8-13 illustrate a method for fabricating a SONOS memory according to the preferred embodiment of the present invention. As shown in FIG. 8, a semiconductor substrate 52 is provided, in which the semiconductor substrate 52 is preferably composed of gallium arsenide (GaAs), silicon on insulator layer, epitaxial layer, silicon germanium, or other common semiconductor substrate materials. Next, a silicon oxide layer 54, a silicon nitride layer 56, a silicon oxide layer 58, and a polysilicon layer 60 is formed on the semiconductor substrate 52.

Figure 9:
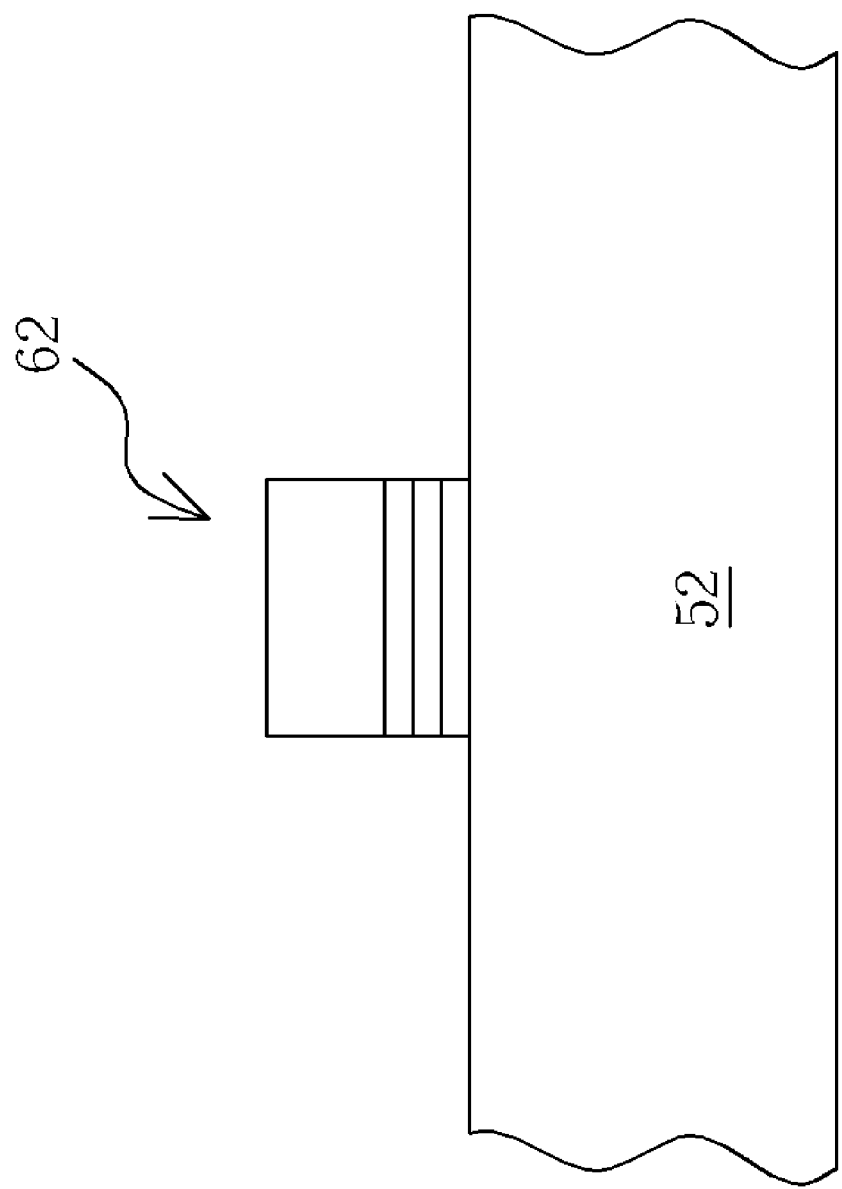

Next, as shown in FIG. 9, a pattern transfer process is conducted by utilizing a patterned photoresist (not shown) as a mask to perform an etching process for removing a portion of the polysilicon layer 60, the silicon oxide layer 58, the silicon nitride layer 56, and the silicon oxide layer 54. The result produces a stacked gate 62 on the semiconductor substrate 52. The stacked gate 62 is preferably composed of a control gate formed by a portion of the polysilicon layer 60 and an ONO structure formed by a portion of the silicon oxide layer 54, the silicon nitride layer 56, and the silicon oxide layer 58. Accordingly, the silicon nitride layer 56 can be used as a charge storage layer while the memory cell is being programmed or erased.

Figure 10:
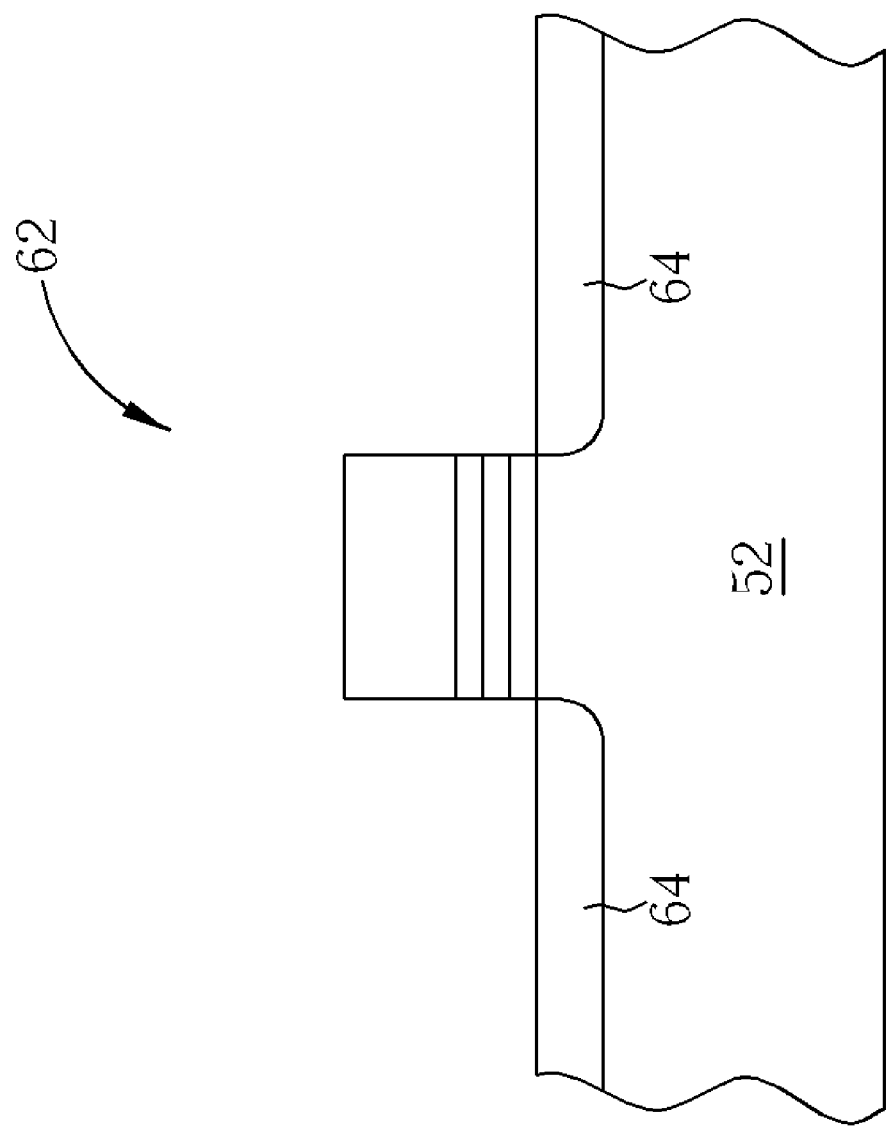

As shown in FIG. 10, an ion implantation process (not shown) is performed by using the stacked gate 62 as a mask to form a source/drain region 64 in the semiconductor substrate 52 beside the two sides of the stacked gate 62.

According to an embodiment of the present invention, after the silicon oxide layer 54, the silicon nitride layer 56, and the silicon oxide layer 58 are deposited on the semiconductor substrate 52, a photoresist (not shown) can be used as a mask to form an ONO structure on the semiconductor substrate 52. An ion implantation process (not shown) can be performed thereafter by using the ONO structure as a mask to form the source/drain region 64 in the semiconductor substrate 52 beside the two sides of the ONO structure. The polysilicon layer 60 can be deposited on the ONO structure thereafter and an etching process can be performed by using another photoresist (not shown) as a mask to form a plurality of control gates and word lines.

Depending on the design of the device, the source/drain region 64 can either be buried doping regions or buried bit lines. In other words, the source/drain region 64 can be buried source/drain regions, which are all within the scope of the present invention.

Figure 11:
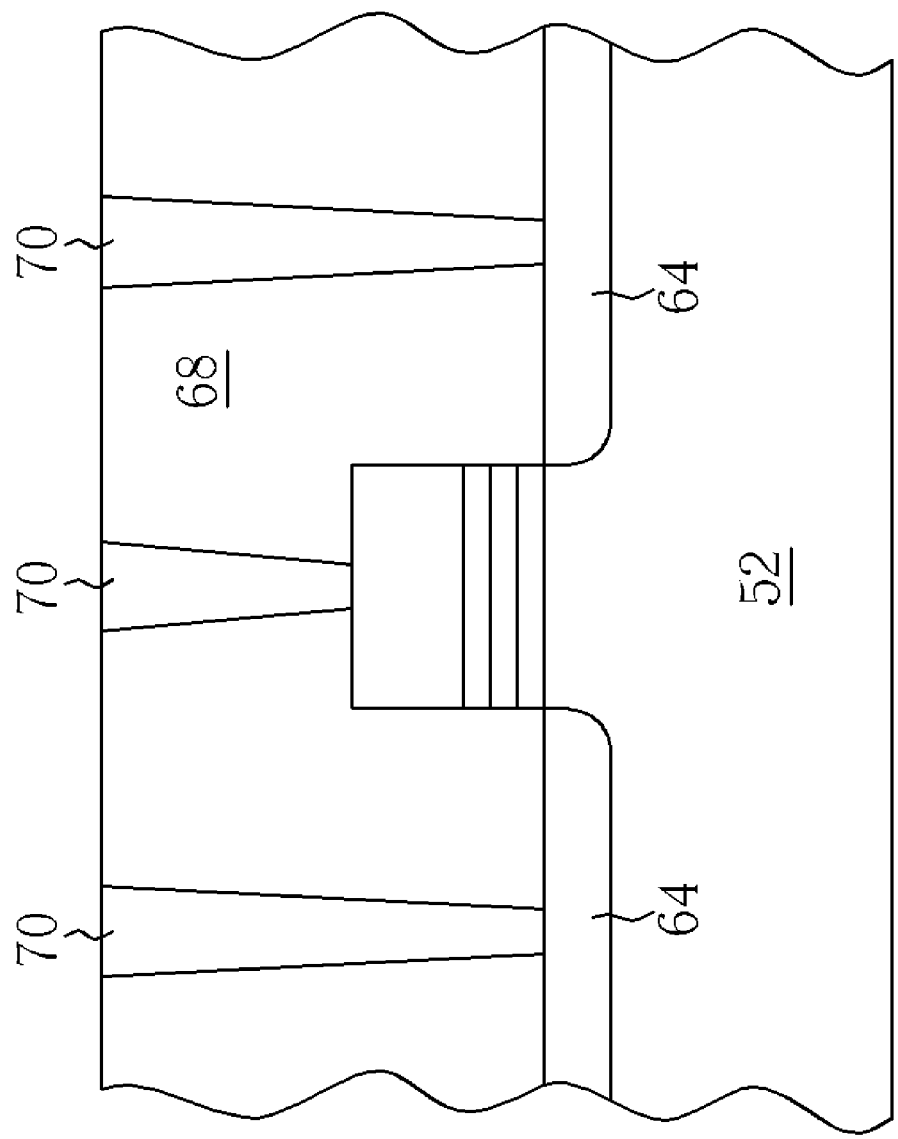

As shown in FIG. 11, an inter-layer dielectric 68 is formed on the semiconductor substrate 52 and the stacked gate 62. Another pattern transfer process is conducted by using a patterned photoresist (not shown) as a mask to perform an etching process for forming a plurality of contact holes (not shown) in the inter-layer dielectric 68. Thereafter, a metal composed of tungsten is deposited on the inter-layer dielectric 68 and into each of the contact holes. A plurality of contact plugs 70 is then formed in the inter-layer dielectric 68.

Figure 12:
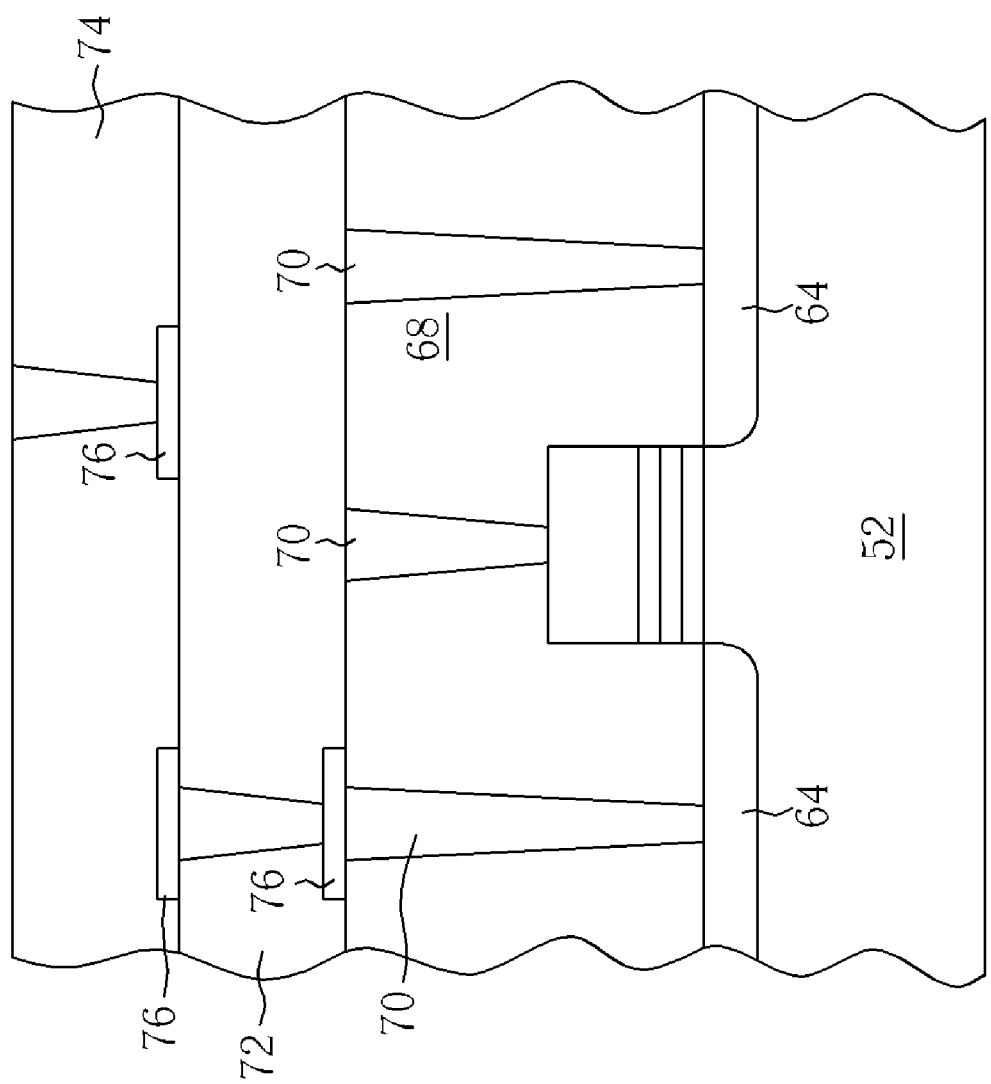

As shown in FIG. 12, a metal interconnection process is conducted by first forming a plurality of inter-metal dielectrics 72 and 74 on the inter-layer dielectric 68 and a plurality of metal interconnects 76 connected to the contact plugs 70.

Figure 13:
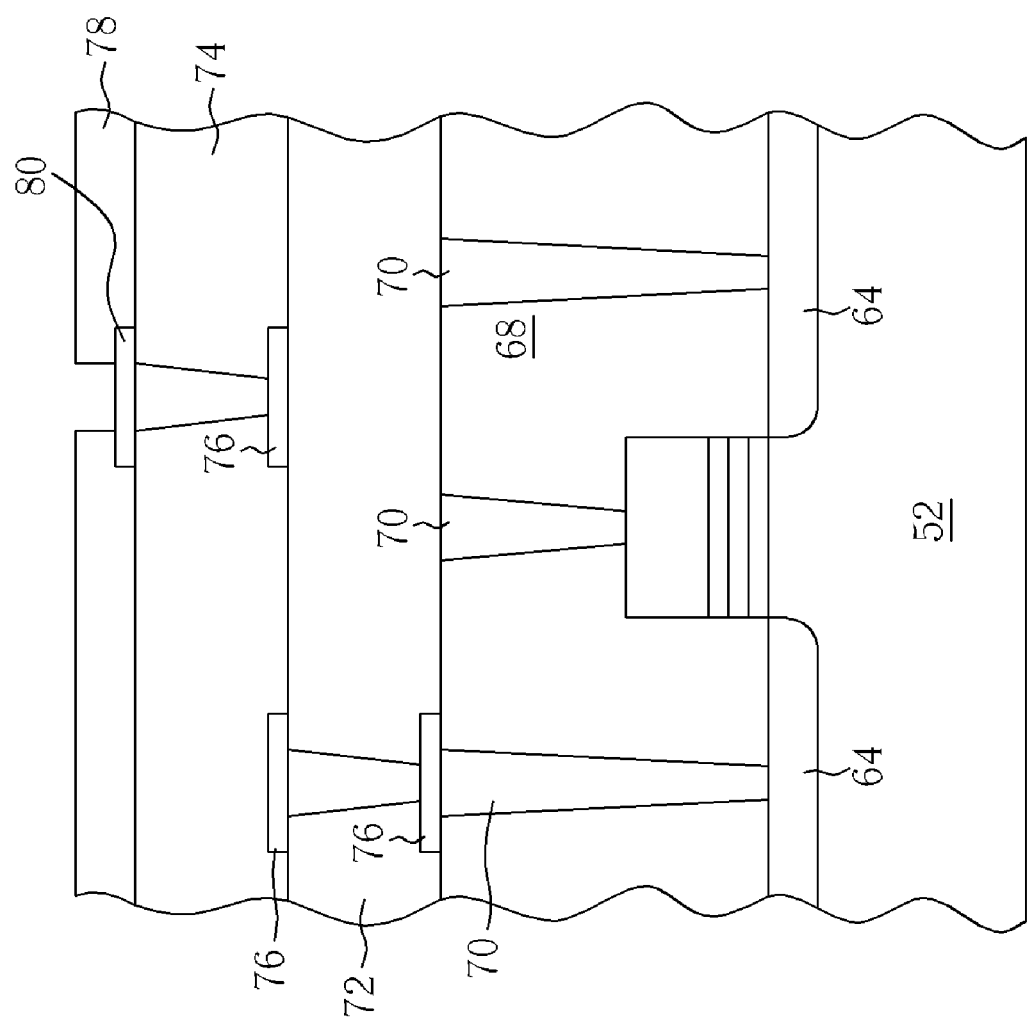

As shown in FIG. 13, a passivation layer 78 is deposited on the surface of the top metal interconnects 76, and a pattern transfer process is conducted by forming a patterned photoresist (not shown) as a mask to perform an etching process for forming an opening in the passivation layer 78. After the opening exposes the top patterned metal interconnect, a contact pad 80 is formed.

After the formation of the contact pad 80, an ultraviolet treatment is performed by using a wavelength of approximately 250 nm and a power between 20 mW to 40 mW to treat the device for about one hour. After the ultraviolet treatment is completed, a low temperature annealing process is conducted by using a temperature between 250° C. to 410° C. to treat the memory device for about 2 hours to reduce the chance of electrical malfunctioning and facilitate a much more even voltage distribution.

It should be noted that the etching process conducted during the stage where the contact pad is fabricated would normally induce a plasma effect. This effect would accumulate charges within the silicon nitride layer of the SONOS memory and result in uneven distribution of the charges. By performing an ultraviolet treatment and an annealing process after the formation of the contact pads, the present invention could resolve this problem effectively. According to the preferred embodiment of the present invention, the specific order of the aforementioned processes not only increases the voltage of the low voltage cells to the central value region and improves the problem of uneven charge distribution, but also provides a much better structural design for the memory, such as allowing multi-level designs.

In addition to the aforementioned plasma effect resulted from the stage where the contact pads are fabricated, the stage where the contact holes are fabricated would also induce similar plasma effect. According to an embodiment of the present invention, an ultraviolet treatment can be performed immediately after the formation of the passivation layer to increase the voltage of the low voltage cells and reduce the phenomenon of uneven charge distribution within the memory. The fabricating parameters used for the ultraviolet treatment performed after the formation of the passivation layer can be the same as the parameters utilized for the ultraviolet treatment performed after the formation of the contact pads. For instance, the ultraviolet treatment can be conducted at a wavelength of about 250 nm and a power between 20 mW to 40 mW for one hour.

According to an embodiment of the present invention, another combination of ultraviolet treatment and a second annealing process can be conducted after the first annealing process, or only another annealing process is performed after the first annealing process is completed. The process parameters of this second annealing process can be the same as the parameters of the first annealing process, such as using a temperature between 250° C. to 410° C. to treat the memory for about 2 hours. Preferably, this second annealing process can be used to return the voltage of the high voltage cells to a neutral state, which are all within the scope of the present invention.

Figure 14:
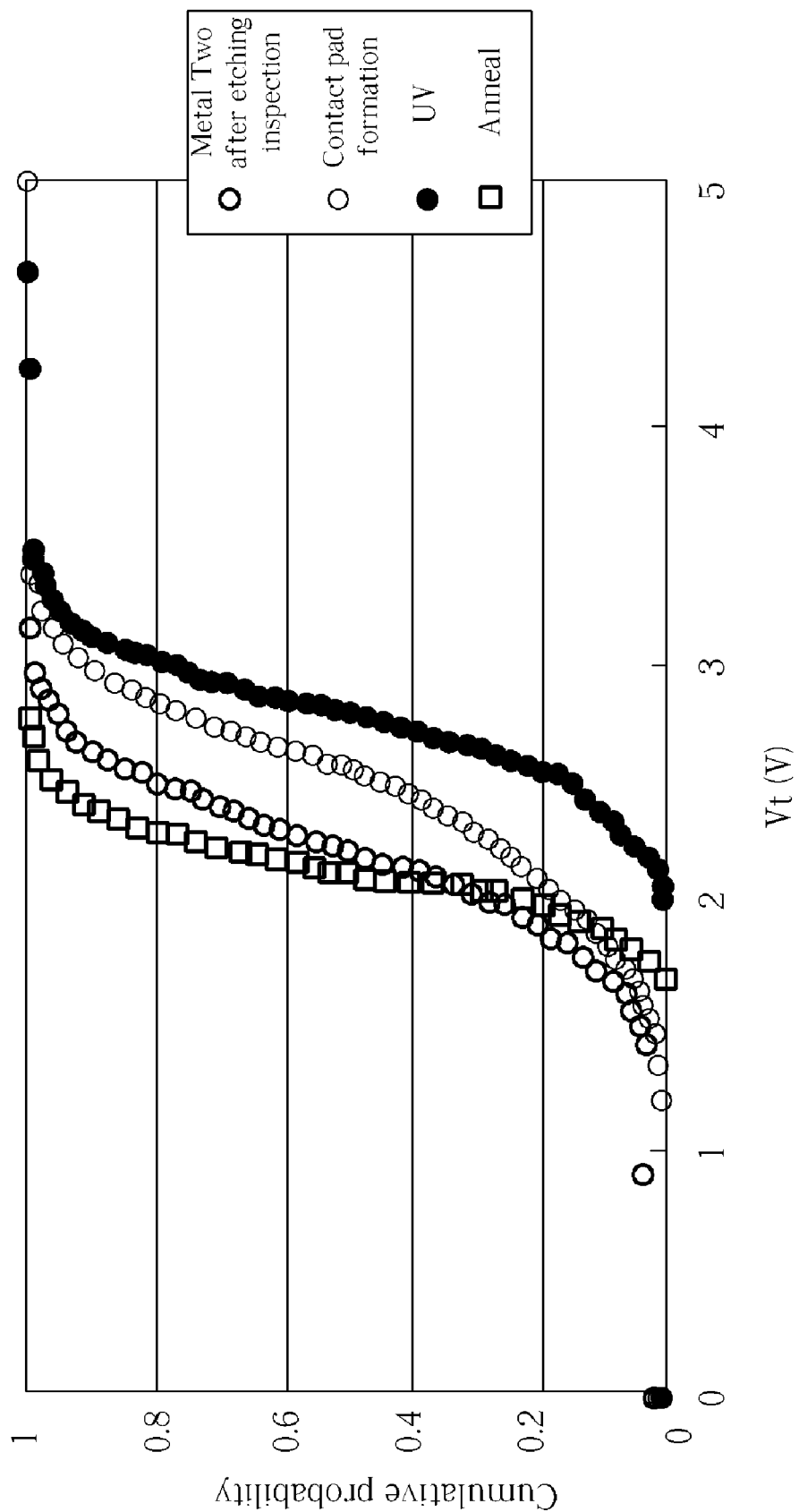
FIG. 14 illustrates the threshold voltage of a SONOS memory during different stages of the fabrication process according to the present invention.

Please refer to FIG. 14. FIG. 14 illustrates the threshold voltage of a SONOS memory during different stages of the fabrication process according to the present invention. As shown in FIG. 14, when the annealing process is performed, the distributing range of the threshold voltage is approximately 1V. In comparison with the conventional distributing range, the narrower distributing range of the threshold voltage obtained by the present invention would increase the sensing boundary of the SONOS memory when the memory is programmed or erased, which ultimately reduces the chance of miscalculation during the sensing stage.

Specifically, the present invention performs an ultraviolet treatment and a follow-up annealing process after the fabrication of the contact pads. Despite the fact that the ultraviolet treatment performed earlier would increase the voltage of both high voltage cells and low voltage cells, the annealing process performed thereafter would return the voltage of both cells to the central value region. In other words, despite the fact that the ultraviolet treatment would raise the voltage level of the high voltage cells and low voltage cells to an upper level, the annealing process performed thereafter would provide a converging effect and return the voltage of the high voltage cells in particular to a neutral state.

In contrast to the conventional method of fabricating SONOS memories, the present invention specifically performs an ultraviolet treatment after the fabrication of the passivation layer and the contact pads is completed and performs an annealing process thereafter. According to the preferred embodiment of the present invention, by conducting an ultraviolet treatment with a follow-up annealing process, a narrower distributing boundary of the threshold voltage can be obtained. This result not only reduces the chance of sensing error, but also improves the drawback of uneven charge distribution resulted from the plasma effect commonly caused during the fabrication of the contact holes or contact pads. In other words, by utilizing the order of performing the ultraviolet treatment first and the annealing process after, the present invention is able to obtain a much more even charge distribution within the memory and at the same time reduce the chance of sensing error caused by overly large distribution range of the initial threshold voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a SONOS memory, comprising:
   providing a semiconductor substrate;
   forming a SONOS memory cell on the semiconductor substrate;
   depositing a passivation layer on the SONOS memory cell;
   forming a contact pad in the opening of the passivation layer;
   performing a first ultraviolet treatment; and
   performing a first annealing process after the first ultraviolet treatment.

2. The method for fabricating a SONOS memory of claim 1 further comprising:
   forming a first silicon oxide layer on the semiconductor substrate;
   forming a silicon nitride layer on the first silicon oxide layer;
   forming a second silicon oxide layer on the silicon nitride layer;
   forming a polysilicon layer on the second silicon oxide layer;
   performing a pattern transfer process to form a stacked gate on the semiconductor substrate; and
   performing an ion implantation process to form a source/drain region in the semiconductor substrate beside the two sides of the stacked gate.

3. The method for fabricating a SONOS memory of claim 1 further comprising:
   forming an oxide-nitride-oxide (ONO) structure on the semiconductor substrate;
   performing an ion implantation process to form a source/drain region in the semiconductor substrate beside the two sides of the ONO structure;
   forming a polysilicon layer on the ONO structure; and
   performing a pattern transfer process to form a stacked gate on the semiconductor substrate.

4. The method for fabricating a SONOS memory of claim 1 further comprising forming an inter-layer dielectric on the SONOS memory cell after forming the passivation layer.

5. The method for fabricating a SONOS memory of claim 4 further comprising forming a plurality of contact plugs in the inter-layer dielectric.

6. The method for fabricating a SONOS memory of claim 5 further comprising performing a metal interconnection process for forming a plurality of inter-metal dielectric and metal interconnects on the inter-layer dielectric.

7. The method for fabricating a SONOS memory of claim 1, wherein the step of forming the contact pad further comprises:

forming a top patterned metal layer;

forming the passivation layer on the top patterned metal layer;

forming a patterned photoresist on the passivation layer; and performing an etching process to form an opening in the passivation layer for exposing the top patterned metal layer.

8. The method for fabricating a SONOS memory of claim 7, wherein the top patterned metal layer comprises copper, aluminum or alloy thereof.

9. The method for fabricating a SONOS memory of claim 1, wherein the power of the first ultraviolet treatment is between 20 mW to 40 mW.

10. The method for fabricating a SONOS memory of claim 1, wherein the wavelength of the first ultraviolet treatment is about 250 nm.

11. The method for fabricating a SONOS memory of claim 1 further comprising performing a second ultraviolet treatment after forming the passivation layer.

12. The method for fabricating a SONOS memory of claim 11, wherein the power of the second ultraviolet treatment is between 20 mW to 40 mW.

13. The method for fabricating a SONOS memory of claim 11, wherein the wavelength of the second ultraviolet treatment is about 250 nm.

14. The method for fabricating a SONOS memory of claim 1, wherein the temperature of the first annealing process is between 250° C. to 410° C.

15. The method for fabricating a SONOS memory of claim 1, wherein the duration of the first annealing process is about 2 hours.

16. The method for fabricating a SONOS memory of claim 1 further comprising performing a second annealing process after performing the first annealing process.

17. The method for fabricating a SONOS memory of claim 1 further comprising performing a second ultraviolet treatment and a second annealing process after performing the first annealing process.

* * * * *